(12) United States Patent
Nicolas et al.

(10) Patent No.: US 9,106,265 B2
(45) Date of Patent: Aug. 11, 2015

(54) RECEIVE DATA FLOW PATH USING A SINGLE FEC DECODER

(75) Inventors: Frederic Nicolas, Chateaugiron (FR); Olivier Souloumiac, Saint Sulpice la Foret (FR); David Rault, Hèdè (FR)

(73) Assignee: Silicon Laboratories Inc., Austin, TX (US)

( * ) Notice: Subject to any disclaimer, the term of this patent is extended or adjusted under 35 U.S.C. 154(b) by 663 days.

(21) Appl. No.: 13/289,390

(22) Filed: Nov. 4, 2011

(65) Prior Publication Data

US 2013/0117624 A1 May 9, 2013

(51) Int. Cl.
*H03M 13/00* (2006.01)
*H03M 13/27* (2006.01)
*H03M 13/29* (2006.01)
*H04L 1/00* (2006.01)
*H03M 13/11* (2006.01)
*H03M 13/15* (2006.01)

(52) U.S. Cl.
CPC .......... *H03M 13/27* (2013.01); *H03M 13/2906* (2013.01); *H03M 13/6552* (2013.01); *H04L 1/0045* (2013.01); *H04L 1/0057* (2013.01); *H04L 1/0071* (2013.01); *H04L 1/0072* (2013.01); *H03M 13/1105* (2013.01); *H03M 13/152* (2013.01)

(58) Field of Classification Search
CPC ............ H03M 13/2957; H03M 13/29; H03M 13/1515; H03M 13/2909; G11B 20/1833
USPC ........................................................ 714/755
See application file for complete search history.

(56) References Cited

U.S. PATENT DOCUMENTS

| 6,166,667 | A  | * | 12/2000 | Park ............................. 341/94 |
| 6,405,338 | B1 | * | 6/2002  | Sinha et al. .................. 714/752 |
| 8,363,738 | B2 | * | 1/2013  | Gorokhov et al. ............ 375/259 |
| 2005/0028065 | A1 | * | 2/2005 | Halter ......................... 714/755 |
| 2007/0033494 | A1 | * | 2/2007 | Wenger et al. ............... 714/776 |
| 2009/0013356 | A1 | * | 1/2009 | Doerr et al. ................... 725/62 |
| 2009/0164866 | A1 | * | 6/2009 | Nakamura et al. ........... 714/756 |
| 2010/0251078 | A1 |   | 9/2010  | Yokokawa et al. |
| 2010/0284472 | A1 |   | 11/2010 | Liao et al. |
| 2011/0037904 | A1 |   | 2/2011  | Yokokawa et al. |
| 2011/0274204 | A1 | * | 11/2011 | Ko et al. ...................... 375/295 |

OTHER PUBLICATIONS

"Digital Video Broadcasting (DVB), Frame structure channel coding and modulation for a second generation digital terrestrial television broadcasting system (DVB-T2)," European Standard (Telecommunications Series) ETSI EN 302 755 v1.1.1 (Sep. 2009), 167 pages, accessed Nov. 4, 2011 at http://www.etsi.org/deliver/etsi_en/302700_302799/302765/01.01.01_60/en_302755v010101p.pdf.
U.S. Appl. No. 13/289,850, filed Nov. 4, 2011, entitled, Packet Synchronization Receiver, naming Frederic Nicolas as inventor.

\* cited by examiner

*Primary Examiner* — Albert Decady
*Assistant Examiner* — Enam Ahmed
(74) *Attorney, Agent, or Firm* — Abel Law Group, LLP (57) ABSTRACT

Data flow control in a television receiver controls the output of the frequency deinterleaver (FDI) and the time deinterleaver (TDI) to prioritize processing control information having transmission parameters needed for processing data, thereby facilitating use of one FEC decoder.

24 Claims, 11 Drawing Sheets

RECEIVE DATA FLOW PATH USING A SINGLE FEC DECODER

CROSS-REFERENCE TO RELATED APPLICATION(S)

This application is related to U.S. patent application Ser. No. 13/289,850, entitled "Packet Synchronization Receiver," naming Frederic Nicolas as inventor, which application is being filed the same day as the present application, and which application is incorporated by reference herewith in its entirety.

BACKGROUND

1. Field of the Invention

The present invention relates a receiver used in digital video broadcasting and in particular to processing of data and control information in the digital video broadcast.

2. Description of the Related Art

Digital video broadcasting operates in some areas of the world, particularly Europe, according to a standard known as DVB-T2. The DVB-T2 standard describes the second generation baseline transmission system for terrestrial television broadcasting. The specification of the DVB-T2 standard is normalized as ETSI EN 302 755, which specification is incorporated herein by reference in its entirety.

Figure 1:
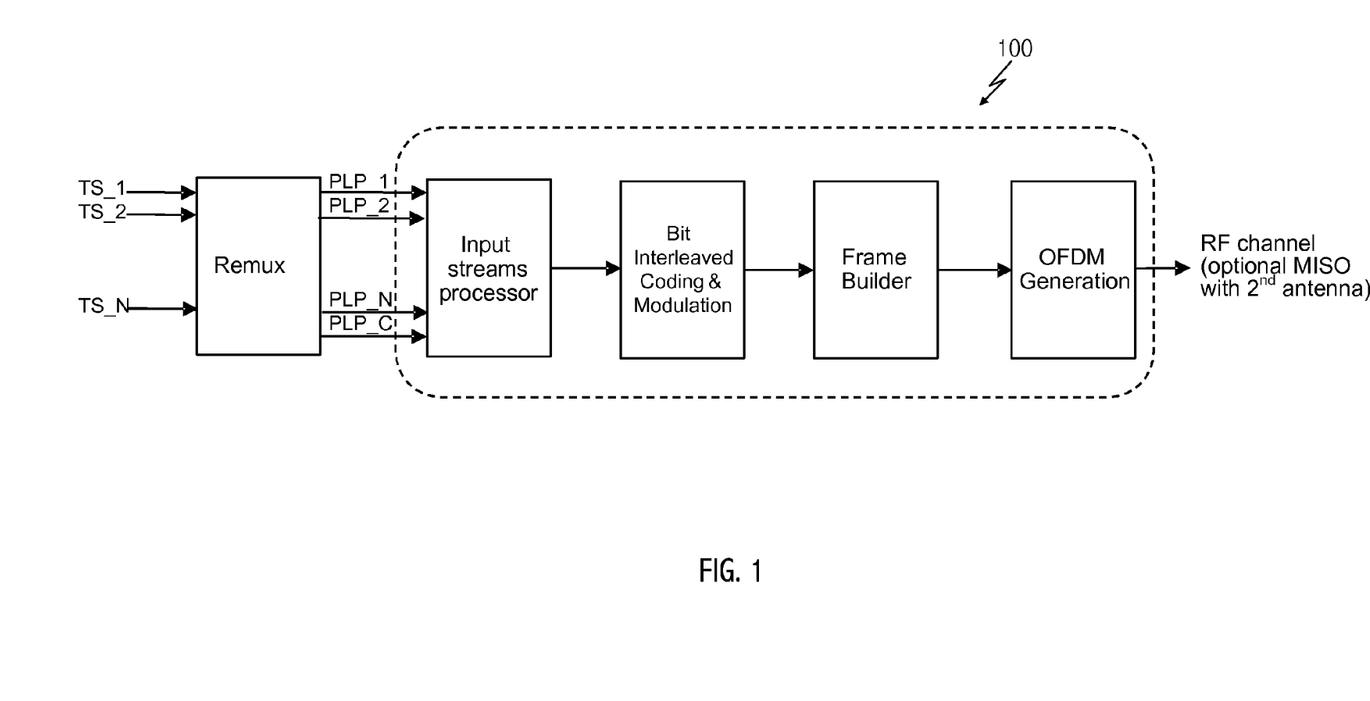
FIG. 1 illustrates a typical DVB-T2 broadcasting application for television broadcasting.
Figure 2:
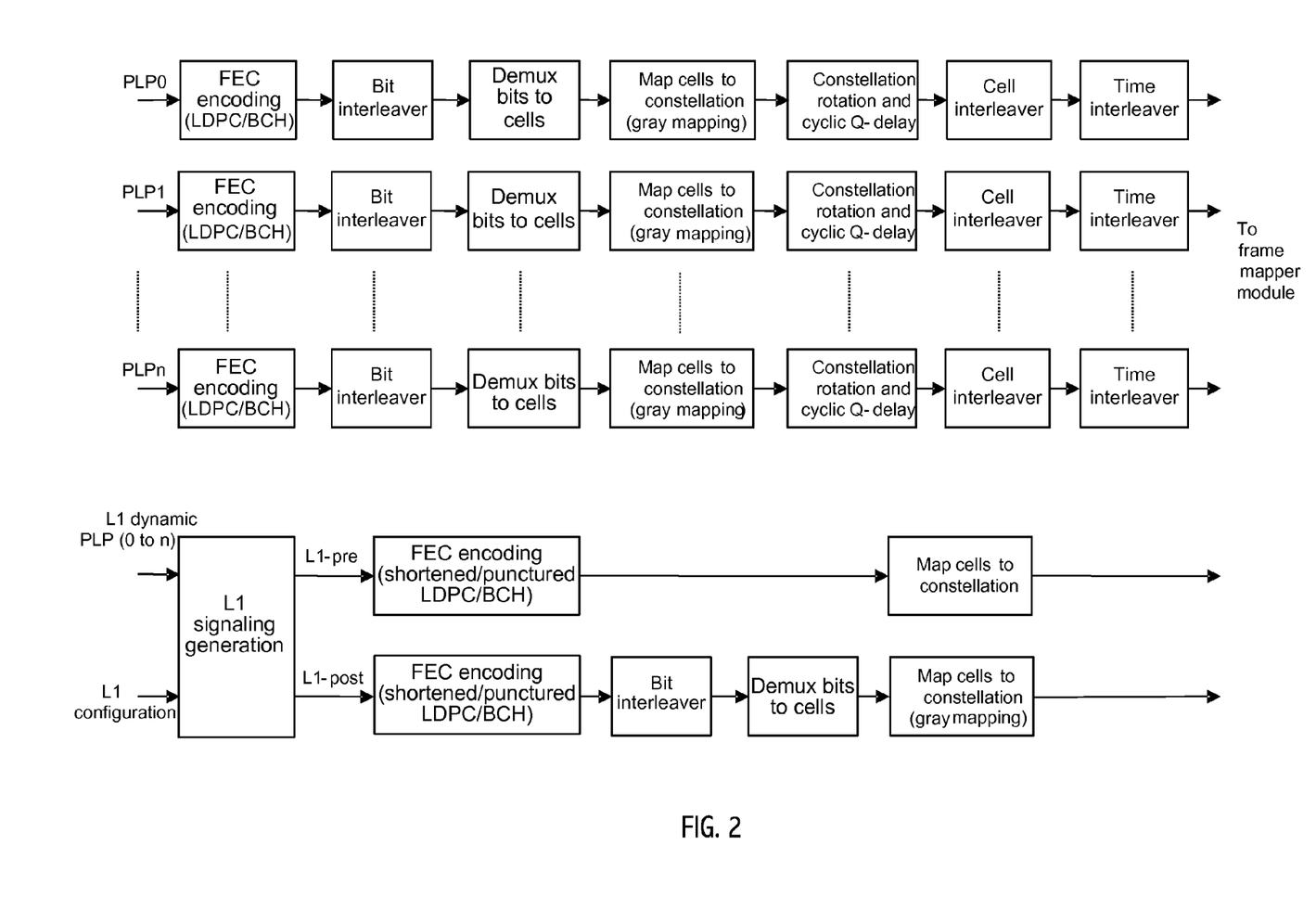
FIG. 2 illustrates a high level block diagram showing coding and modulation for PLPs and L1 signaling.
Figure 3:
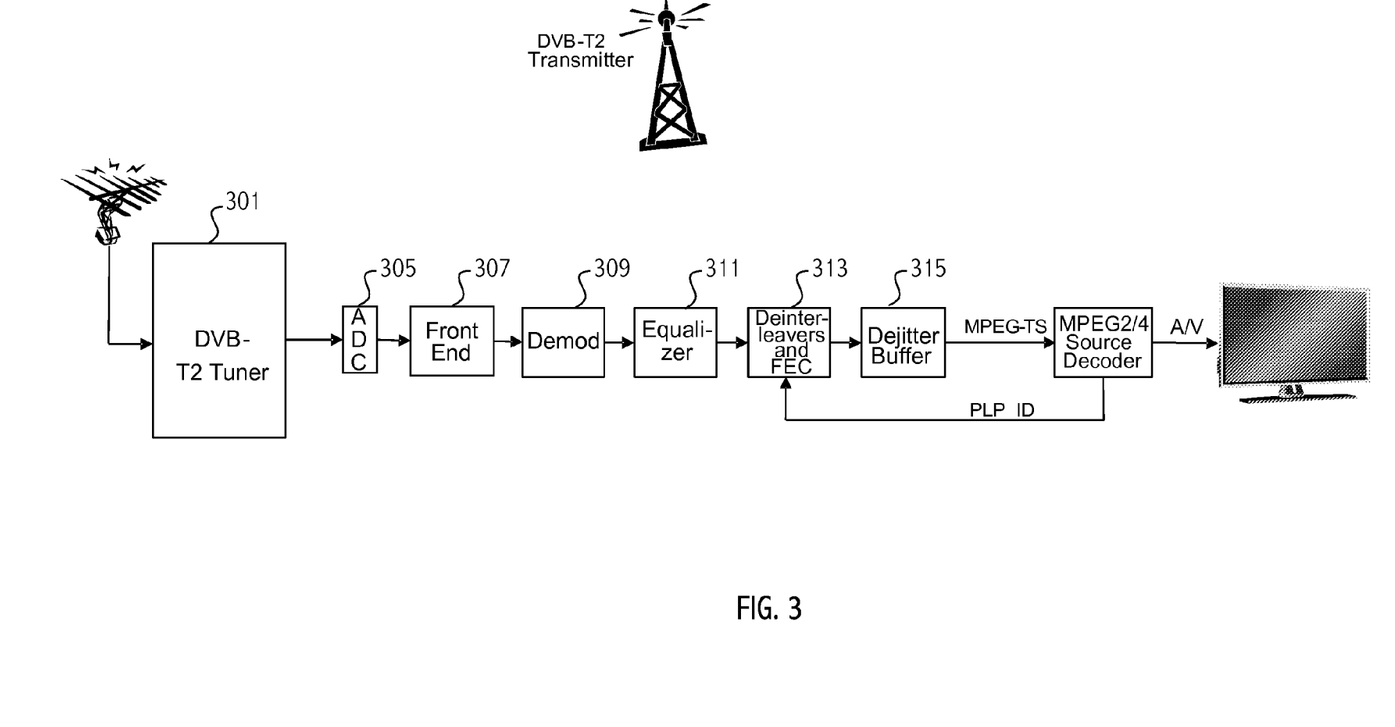
FIG. 3 illustrates an exemplary receiver.

FIGS. 1-4 illustrate various aspects of a conventional DVB-T2 system. FIG. 1 illustrates an exemplary high level block diagram of a system 100 for generation of video signals. FIG. 2 illustrates various coding details associated with processing data streams in Physical Layer Pipes (PLPs) and associated control information L1. FIG. 3 illustrates a high level diagram of an exemplary receiver that includes a tuner 301, an analog to digital converter (ADC) 305, a front end 307, a demodulator 309, an equalizer 311, deinterleavers and forward error correction (FEC) 313 and a dejitter buffer 315. According to the DVB-T2 standard, the data streams treated in the FEC part of the receiver include two different kinds of Physical Layer Pipes (PLPs), namely the Data PLP and Common PLP (if any), plus the Layer 1 signaling (L1), which transports the transmission parameters associated with the PLPs. The Common PLP may contain data that is shared among one or more Data PLPs. Data, Common PLPs and L1 are all encoded using forward error correction (FEC) low density parity codes (LDPC)/BCH, and are multiplexed in time. Both LDPC and BCH are well known error detection and correction schemes.

Figure 4:
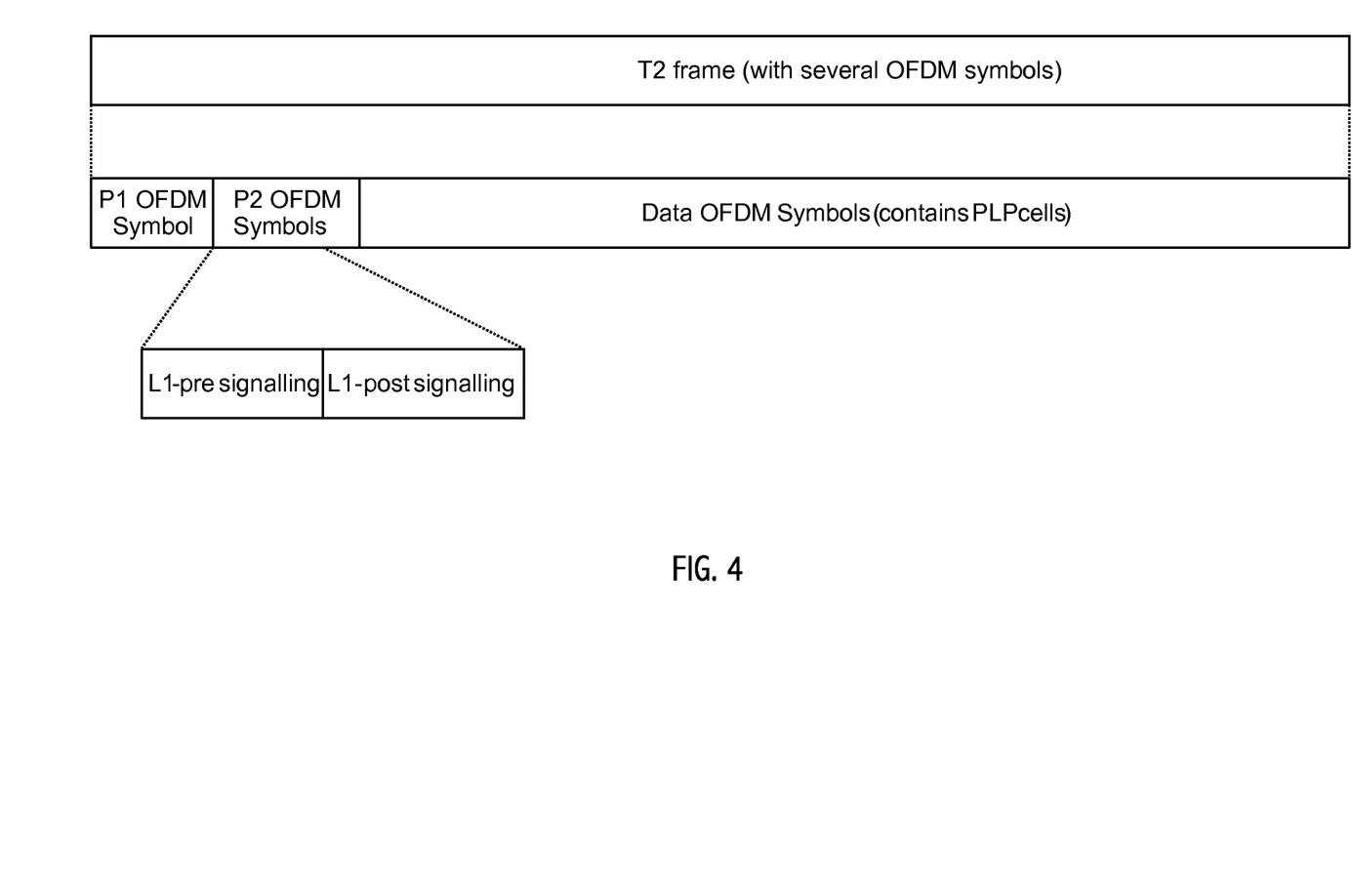
FIG. 4 illustrates an exemplary T2 frame.

FIG. 4 illustrates a T2 frame in which control information P1 and P2 are shown to come at the beginning of a T2 frame. The P1 symbol carries S1 and S2 signaling fields. The P1 symbol is mainly used for fast initial band scan to detect the T2 signal, its timing, frequency offset, and FFT-size. The P2 symbol is a pilot symbol located right after P1 in the frame and has the same FFT-size and guard interval as the data symbols. The number of P2 symbols depends on the FFT size. P2 symbols carry L1 signaling information. L1-pre signaling has a fixed size, coding and modulation, and includes basic information about the T2 system as well as information needed to decode the L1-post signaling. L1-post signaling carried in the P2 symbol carries more detailed L1 information about the T2 system and the PLPs.

At the receiver side, decoding of Data PLPs, Common PLPs, and L1 signaling can be considered as asynchronous, as L1 is not time-interleaved, while usually Data and Common PLPs are, but have different time interleaving parameters. Additionally, L1 is decoded before the PLPs of a new DVB-T2 frame can be written into the memory of the time deinterleaver. At the output interface, namely the dejitter buffer, the dejitter buffer may receive the PLPs in burst and the dejitter buffer has to buffer those PLPs in memory in order to be provide a regular (as opposed to jittered) output stream on the MPEG-TS interface. Additional information on these and other aspects of DVB-T2 systems can be found in ETSI EN 302 755.

SUMMARY

According to one aspect, data flow control in a receiver for television signals uses control logic, which may be part of the deframer, to control the output of the frequency deinterleaver (FDI) and the time deinterleaver (TDI) to prioritize processing control information that includes transmission parameters needed for processing data, thereby facilitating use of one FEC decoder.

In an embodiment a receiver is provided that includes a frequency deinterleaver (FDI) coupled to receive data and control information including transmission parameters associated with the data and supply frequency deinterleaved cells corresponding to the data and frequency deinterleaved cells corresponding to the control information. A time deinterleaver (TDI) generates forward error correction (FEC) blocks based on the frequency deinterleaved cells. A forward error correction (FEC) circuit is coupled to the time deinterleaver to apply forward error correction to FEC blocks and is coupled to the frequency deinterleaver to apply forward error correction to the control information. The control logic controls outputs from the frequency deinterleaver and the time deinterleaver to prioritize processing of the control information in the FEC circuit. The forward error correction circuit may include a BCH decoder and a low density parity code (LDPC) decoder and processing of the control information is prioritized without interrupting decoding by the LDPC and BCH decoder. Thus, decoding data of a previous frame can be completed while still prioritizing the control information.

In another aspect, in order to provide efficient transport stream dejitter using the overall memory resources of the receiver without adding additional memory, FEC outputs from the time deinterleaver (TDI) and/or forward error correction processing in the FEC circuit may be scheduled according to programmable time periods. Accordingly, a first programmable time period may be associated with the output rate of FEC blocks from the TDI. A second programmable time period may be associated with FEC decoding.

In another aspect, the receiver includes a frequency deinterleaver (FDI) and a time deinterleaver (TDI) coupled to receive data from the FDI and having a time deinterleaver memory. A forward error correction circuit is coupled to the time deinterleaver. A dejitter buffer is coupled to the forward error correction circuit and has a first memory portion for a first data type and a second memory portion for a second data type. The dejitter buffer is coupled to the forward error correction circuit and the dejitter buffer is configured to monitor the first and second memory portions of the dejitter buffer to supply a control signal to stop output of the time deinterleaver if at least one of the memory portions of the dejitter buffer has an amount of data above a threshold.

In an embodiment, the control logic is responsive to which of the first and second memory portions of the dejitter buffer circuit are above the threshold to stop output of a corresponding one of the first and second data types, and when output of a first data type is stopped in the TDI, the TDI outputs the second data type.

In an embodiment, control logic is associated with the time deinterleaver to determine an available storage in the time deinterleaver memory and to supply a control signal to temporarily stop outputting of the data from the frequency deinterleaver if the available storage in the time deinterleaver memory is below a threshold.

In another aspect, a method is provided that includes monitoring a first portion of a dejitter buffer memory for a first data type and a second portion of a dejitter buffer memory for a second data type. A control signal is supplied to stop upstream generation of data if at least one of the first and second portions of the dejitter buffer memory has an amount of data above a threshold, thereby indicating a potential overflow condition.

In another aspect, a method of processing data and control information in received television signals is provided that includes receiving an indication of a start of a frame that includes the data and control information. Output from a time deinterleaver (TDI) of forward error correction (FEC) blocks associated with the data is stopped in response to the indication. A request is sent to a frequency deinterleaver to output the control information. A control signal is sent to the time deinterleaver to resume outputting the data when the control information has been processed by a forward error correction decoder.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION OF THE PREFERRED EMBODIMENT(S)

In order to reduce complexity and power consumption of a DVB-T2 receiver, in an embodiment, it may be advantageous to use only one forward error correction (FEC) block decoder that includes a bit deinterleaver, an LDPC decoder and a BCH decoder. The FEC has to decode two types of FEC blocks: PLPs (Physical Layer Pipes) denote data streams and L1 (layer 1), which contains the control information (physical layer transmission parameters) associated with particular data streams and more general parameters of the DVB-T2 system. But PLPs and L1 signaling are seen by the receiver as two asynchronous data flows. Moreover, the L1 signaling needs to be processed quickly in order to get the required information to select the appropriate cells corresponding to the requested PLPs and other relevant parameters. The PLPs are multiplexed in time on a T2 frame after L1 signaling (see FIG. 4). A PLP has its own constellation and code rate and the position and the number of FEC blocks within a PLP can vary between T2 frames. Therefore, in order to process PLPs of a new T2 frame, the L1 signaling processing is mandatory and is a priority. Moreover, if it takes too much time to process L1 signaling, the frequency deinterleaver memory could overflow resulting in loss of PLP cells.

To allow utilization of a single FEC decoder for processing data (Data and Common PLPs) and control information (L1), control logic can request interruption of the time deinterleaver (TDI) output. Interrupting output from the TDI helps ensure that the FEC decoder is available for processing the L1 signaling as soon as L1 is ready. That helps avoid interrupting the FEC decoder processing of its current FEC block. The goal is to only interrupt the TDI and the bit deinterleaver for L1 processing. As explained more fully herein, the TDI then waits for a new request to output the FEC block of the Data or Common PLP that may have been interrupted. During the TDI wait period, the control logic requests the FDI supply the L1. The bit deinterleaver detects the modification on the type of data from PLP to L1 signaling and starts the L1 processing required.

Figure 5:
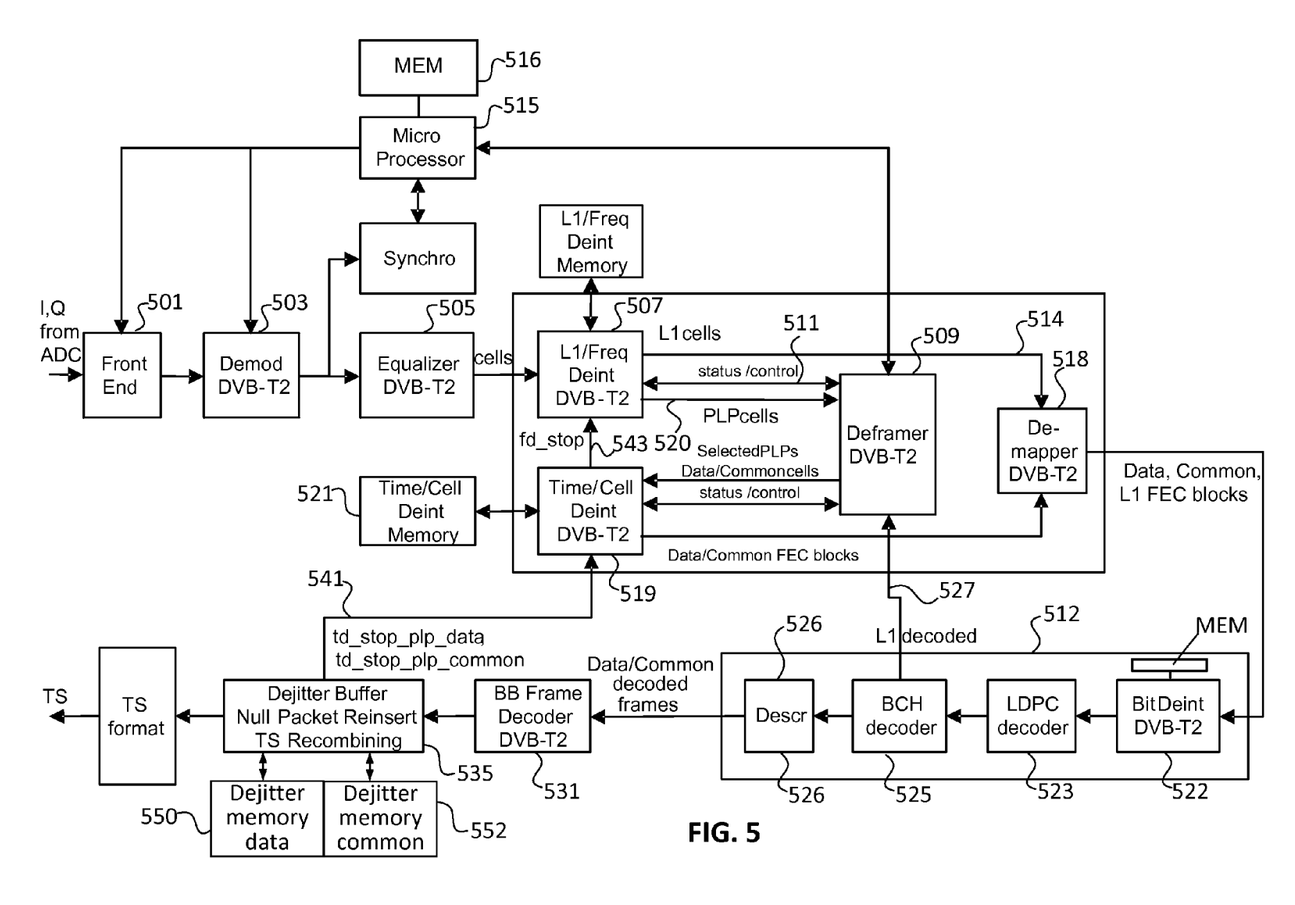
FIG. 5 illustrates a block diagram of a demodulator main block diagram with one FEC to decode L1 signaling and Data/Common PLPs according to an embodiment.

FIG. 5 illustrates a high level block diagram of a portion of an exemplary DVB-T2 receiver according to an embodiment of the invention. The exemplary receiver can consecutively decode L1 and PLPs with a common, shared FEC without any overflow or underflow of the different buffers associated with, e.g., the frequency deinterleaver (FDI), the time deinterleaver (TDI), and the dejitter buffer. The receiver buffer model of the DVB-T2 specification assumes no underflow/overflow occurs by using, e.g., an additional 4000 cell first-in first-out (FIFO) buffer to guarantee that the TDI buffer will not overflow near the beginning of the frame because the FEC chain might be occupied decoding the L1 signaling. The control mechanisms described herein to control output of the TDI help avoid the need for such FIFO buffering, resulting in saving power and space.

Referring to FIG. 5, a terrestrial DVB-T2 signal is received by a tuner (see FIG. 3), which provides the analog DVB-T2 base band signal. The base band signal is converted to a digital signal by the ADC (see FIG. 3) and after processing in the Front End 501, Demodulator 503 and Equalization blocks 505, cells (I and Q) of each useful data carrier of each OFDM symbol (except for the OFDM P1 symbols) are provided to the frequency deinterleaver (FDI) 507. The frequency deinterleaver provides status of its internal processing (L1-pre ready to output, L1-post ready to output, data_ready to output) over status/control signal lines 511 to the deframer 509, which can control the output of the FDI using requests to the FDI based on FDI status. The FDI 507 supplies L1 cells over signal lines 514 to demapper 518 and PLP cells to the deframer 509 over signal lines 520. The demapper 518 receives I, Q and confidence information. Using these inputs, the demapper computes estimated Log Likelihood Ratio (LLR) for each bit depending on constellation and rotation. This is provided to the FEC decoder block 512. The deframer 509 manages the two flows from FDI 507, one with the signaling (L1-pre, L1-post) and the other with the data. Using the signaling and based on the PLP_id chosen, the deframer selects the cells to forward to the TDI 519 for deinterleaving and generation of FEC blocks. Note that the L1 cells provided by FDI 507 may bypass the deframer 509.

Figure 6:
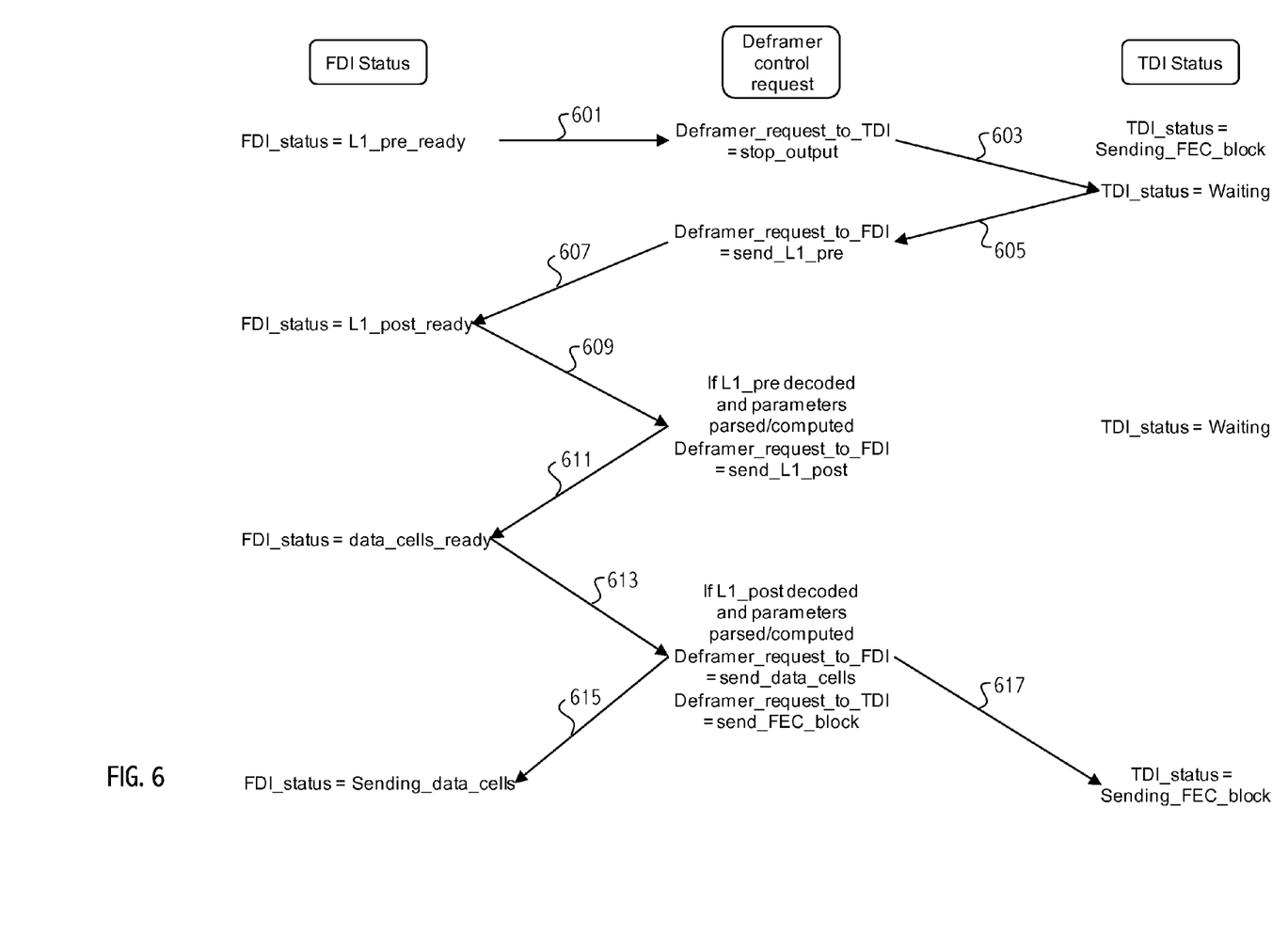
FIG. 6 illustrates data flow control by control logic to give priority to the L1-pre and L1-post decoding.

Referring to FIG. 6, an exemplary flow diagram of operations of the deframer control of the FDI and TDI is shown. FIG. 6 shows FDI and TDI status and deframer control requests based on the status. At 601 the FDI provides to the deframer 509 L1_pre_ready status indicating the FDI is ready to provide the L1_pre signaling information. In response to the availability of L1_pre signaling, the deframer control requests the TDI to stop outputting FEC blocks to the demapper at 603. At 605 the TDI provides the status of waiting at 607 to the deframer control logic indicating the TDI stopped status. When the TDI stops, the bit deinterleaver 522 in the forward error correction block 512 is then available for utilization for L1 processing, and the deframer requests the FDI to output L1 at 605. That is the condition for the deframer 509 to request the FDI to output L1 at 607. At 609 the FDI provides the status to the deframer 509 of L1_post_ready indicating the FDI is ready to provide the L1_post data. When L1_pre is decoded and the parameters needed for L1_post processing are parsed and computed, the deframer requests the FDI to output L1_post signaling information at 611. At 613, the FDI provides a status indicating that PLP data cells are ready.

After L1 decoding, the deframer computes the parameters that allow selection of the cells of the requested PLPs for the TDI. Then the deframer requests the FDI and the TDI to again provide data. The selected cells output by the deframer 509 for Data PLP and Common PLP (if any) are time and cell deinterleaved in the time/cell deinterleaver (TDI) 519 before being provided as an FEC block for decoding. When L1_post is decoded and the parameters needed for further processing of PLP data cells are parsed and computed, the deframer requests the FDI to send data cells at 615. Since L1 has been processed, the FEC block 512 is again available for processing PLP Data or Common cells, and at 617 the deframer control logic sends the request to the TDI to resume output and supply FEC blocks. As shown in FIG. 6, the TDI status had been waiting since the stop_output request at 603. Note that the control logic may be incorporated into the deframer in hardware, e.g., in state machines, or may be implemented in software stored in memory for execution in a microcontroller or microprocessor 515 to effectuate the control functionality shown in FIG. 6 or in a combination of hardware and software according to the processing requirements of the system.

The time/cell deinterleaver 519 provides Data or Common PLP FEC blocks successively for the demapper 518 and the FEC 512. In certain embodiments an approach may be used to prevent underflow or overflow of the main FEC memories without requiring any additional FIFO buffering by scheduling output of FEC blocks from the TDI according to a first programmable value. The first programmable value provides the number of clock cycles between the start of one FEC block and the start of the next FEC block. Thus, the programmable value sets the output FEC block rate. The provision of TDI FEC blocks may be timed according to a first programmable value (a number of clock cycles) depending on the bit rate in order to avoid overflow or underflow in the time cell deinterleaver memory 521. The first programmable value for the TDI allows smoothing the output of FEC blocks, and so helps the dejitter buffer. The programmable value may depend on parameters such as constellation, code rate, with/without L1 signaling, single or multiple PLPs, future extension frames (FEFs), the Transport Stream (TS) rate. Of course, other parameters in addition to, or in place of those just described may be utilized to determine the programmable values.

In order to get more flexibility, another programmable value may be implemented (which may be different from the first programmable value), which corresponds to the number of clock cycles to use for the LDPC decoding of one FEC block. The second programmable value for the FEC allows adapting the decoding time period to be ready for an eventual L1 processing with the tradeoff to get good LDPC decoding performances. In an embodiment, the number of clock cycles for the LDPC decoding is lower than or equal to the number of clock cycles allocated to the time cell deinterleaver. That provides flexibility in order to get a good tradeoff between dejitter buffer underflow/overflow, FEC availability for L1 decoding, and LDPC/BCH decoding performances. The programmable values are, of course, different for short frames and normal frames (respectively, FEC block of 16200 bits and 64800 bits).

A specific programmable time to decode L1 signaling may also be implemented. The scheduling of L1 is relatively straightforward and is based on successive FEC block processing using the first programmable value that determines the TDI FEC block generation rate and the second programmable value for determining the decoding rate. The second programmable value may be used in determining processing allocated to each module working on the FEC block provided by the TDI such as the bit deinterleaver, the LDPC decoder, the BCH decoder (but not necessarily by the demapper and descrambler). Depending on the type of FEC block (L1-pre FEC block, L1-post FEC block, normal data FEC block, short data FEC block) the programmable values differ.

Figure 7:
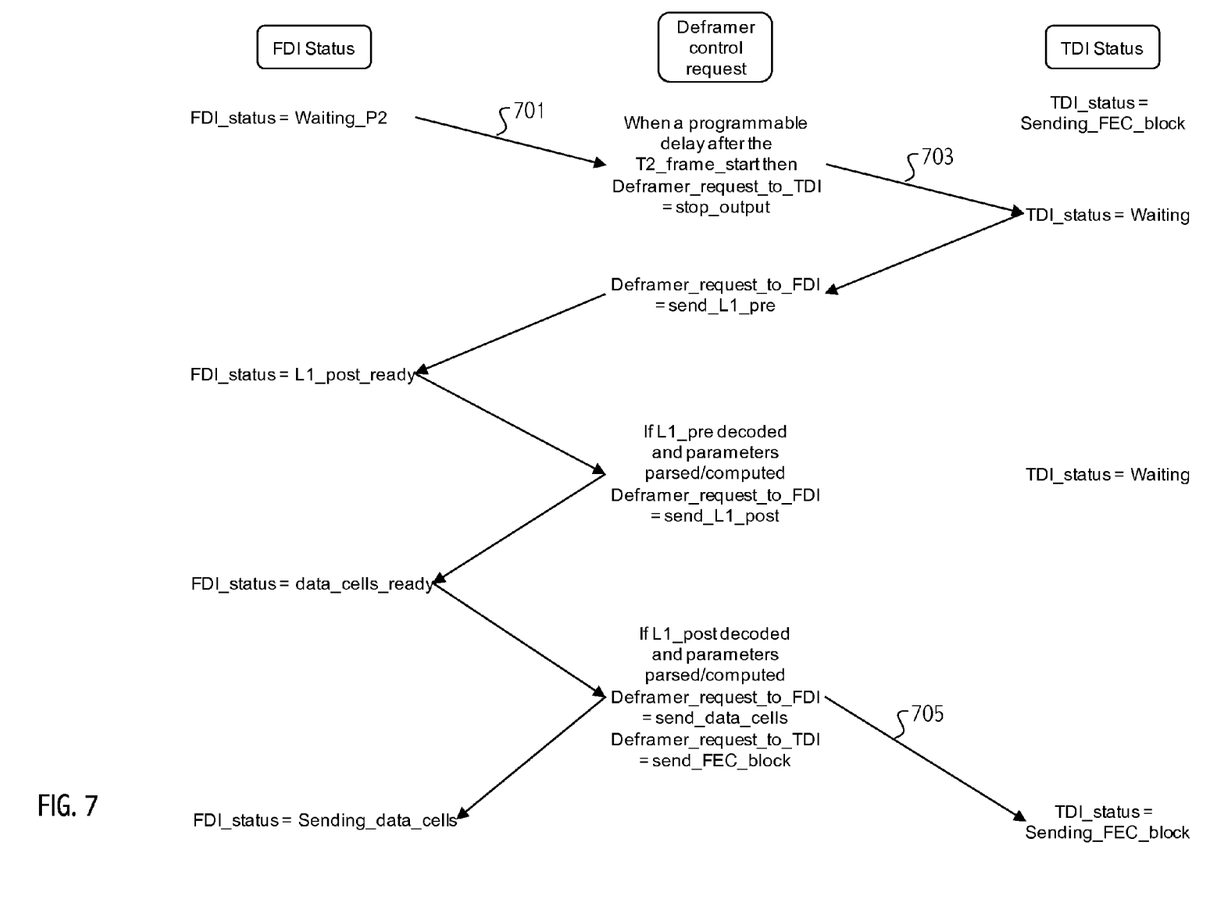
FIG. 7 illustrates data flow control by control logic to give priority to the L1-pre and L1-post decoding by reserving the FEC based on a programmable delay after start of the T2 frame.

As illustrated in FIG. 7, in order to secure FEC availability for processing L1, in an embodiment the deframer may request an interruption of the TDI output before the L1-pre or L1-post is ready to be output by the frequency deinterleaver. The interrupt request may be done in response to each T2 frame start based on an indication provided from the equalizer 505 or the request may be made a programmable delay after the frame start. In an embodiment, frame start may be based on information from the FDI. Providing the interrupt allows the FEC to be reserved or scheduled to quickly process the L1 signaling as soon as the L1 signaling is ready. The scheduling in that manner also helps avoid interrupting the FEC and helps allow the FEC to finish its current processing. Referring to FIG. 7, the FDI supplies the status of waiting for P2 at 701, which is an indication of start of frame. Either immediately, or a programmable delay after the start of the T2 frame, the deframer control logic requests the TDI to stop its output. The remainder of the processing is similar to that shown in FIG. 6. The TDI status remains interrupted until L1 signaling has been processed, and the TDI then resumes sending FEC blocks at the request of the deframer control logic at 705.

Figure 8:
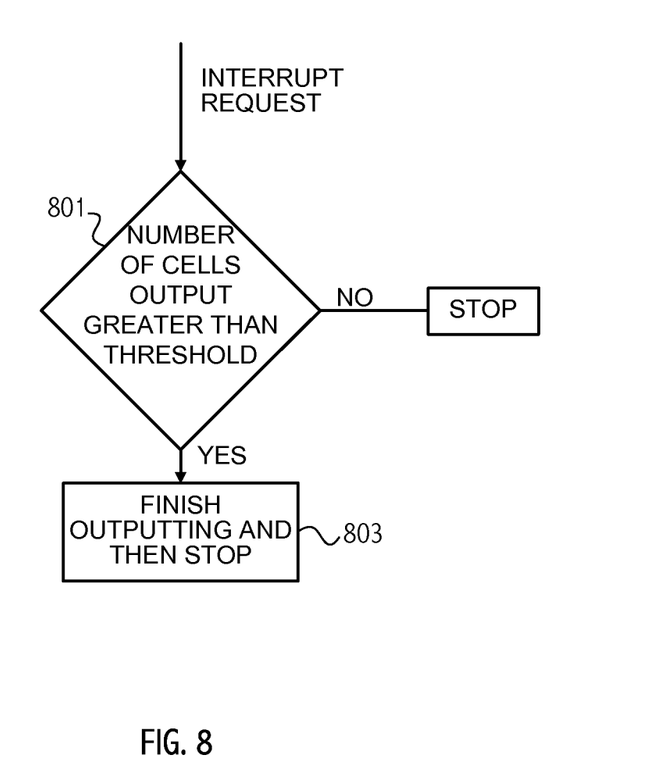
FIG. 8 illustrates TDI management of the deframer interrupt request to either stop output of the FEC block or to continue outputting the FEC block for the bit deinterleaver, according to a threshold number of cells that have been output.

The interrupt request may be responded to by the TDI in various ways. In one embodiment, the TDI finishes outputting the current FEC block. In another embodiment, the TDI stops outputting the current FEC block in response to the interrupt request. In still another embodiment, as shown in FIG. 8, the TDI finishes the current FEC block or stops outputting the current FEC block according to a programmable threshold number of cells already output. The TDI compares the number of cells already output to a threshold number of cells in 801. The threshold may be, e.g., 50% or 75% of the FEC block. If the number of cells already output at the time of the interrupt request is greater than the threshold, then the TDI finishes outputting the current FEC block at 803. If, on the other hand, the number of cells output is less than the threshold, the TDI stops outputting cells at 805.

When the TDI output is stopped, it waits for a request from the deframer to restart outputting the potentially interrupted Data/Common FEC block and/or the next FEC block. Then the bit deinterleaver detects the new start FEC block and/or the missing data to restart bit deinterleaving process. Thus, the bit deinterleaver may lose the portion of the FEC block that was partially sent and in an embodiment the TDI has to resend the entire interrupted FEC block including data that was already sent. The TDI keeps the entire FEC block in TDI memory until the last data of the FEC block is sent out. In another embodiment, additional memory may be used, e.g., associated with the bit deinterleaver, to store the partially generated FEC block so the TDI does not have to resend the entire FEC block, only that portion not yet sent. If such additional memory is available, the TDI starts sending the FEC data at the point that it was interrupted.

The bit deinterleaving memory may be used for L1 even when there is no deinterleaving required, e.g., there is no bit deinterleaving required for L1-pre as can be seen from the processing shown in FIG. 2. As also can be seen in FIG. 2, L1-post is subject to bit interleaving. For L1-pre and L1-post which are punctured and padded code, the bit deinterleaver prepares the FEC block for decoding by the LDPC decoder. In order to avoid FDI buffer overflow, the bit deinterleaver memory stores L1-pre and L1-post from the FDI and performs any required bit deinterleaving. The bit deinterleaver also adds padding and removes puncturing to prepare for the LDPC decoding. The padding and puncturing settings are extracted from L1 signaling by the deframer and provided to the bit deinterleaver. The bit deinterleaver uses these settings to de-puncture and to pad the FEC block. The bit deinterleaver may share memory with LDPC decoder in order to reduce memory and latency. That helps avoid the need for a specific memory for L1 signaling.

As is common in digital transmission systems, scrambling is implemented on transmission to avoid, e.g., transmitting an entire frame of all 1s or all 0s, which can result in undesirable power being output by the modulator output power amplifier (which is not good for linearity). Thus, the scrambling implemented on transmission requires the descrambler 526 in the receiver.

Figure 9:
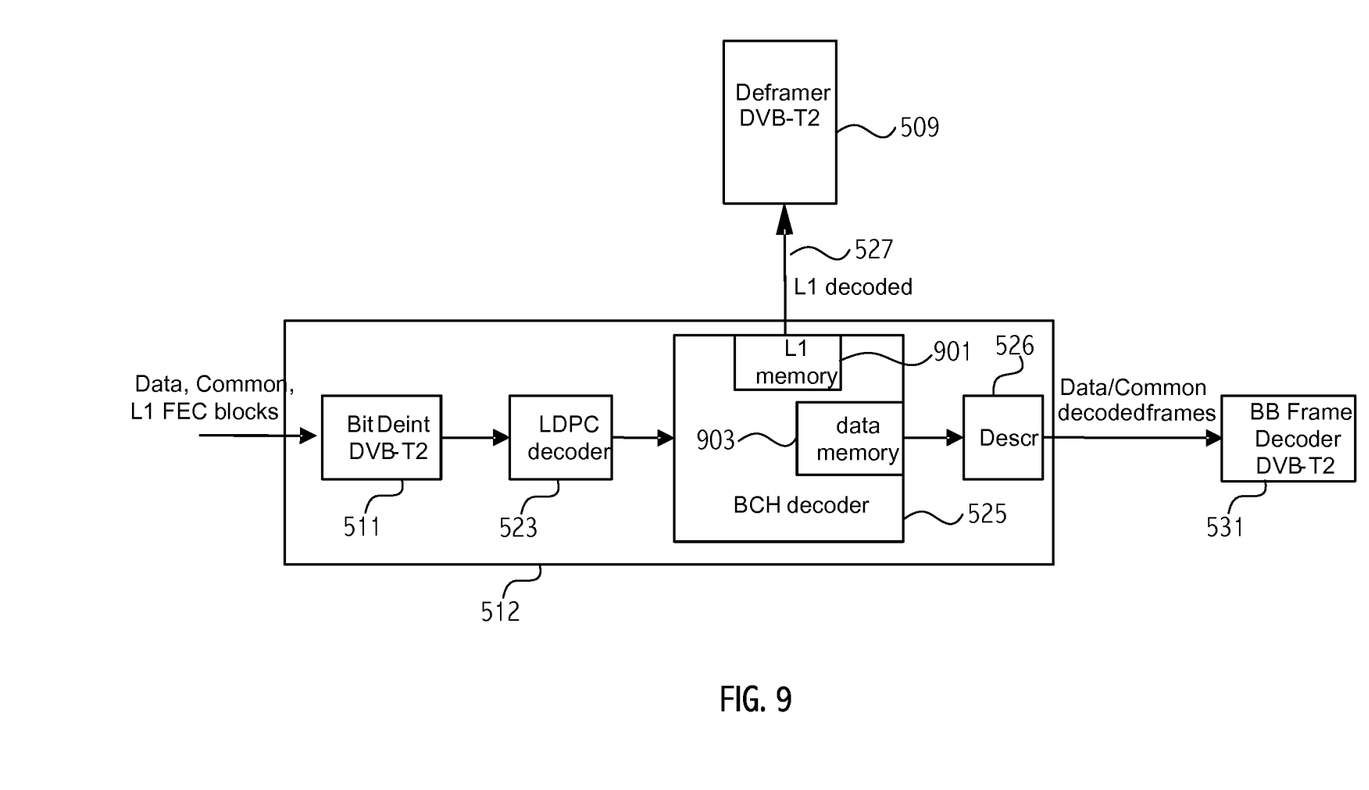
FIG. 9 illustrates additional details of the BCH decoder in the FEC decoder block.

Referring again to FIG. 5, the decoded L1 signaling from the BCH decoder 525 is supplied on 527 and used by the deframer. The BCH decoder supplies the Data or Common PLP FEC blocks for Base Band (BB) frame decoder 531 which parses the BB frame header to provide the data and common packetized streams to the dejitter buffer circuit 535. As shown in FIG. 9, to quickly output in burst the L1 signaling, the BCH uses separate memory portions 901 for L1 signaling and 903 for data memory. In various embodiments the memory portions are separate physical memories, so memory activity in one memory does not affect the other memory. That allows continued output of regular data or common FEC blocks (not in burst) to the dejitter buffer circuit 535. Moreover, this interface memory 901 may be used to store L1 signaling for a cyclic redundancy check (CRC), which can be particularly useful when L1 signaling is spread over several FEC blocks, as may be the case for L1-post. Remember that BCH decoding is not interrupted for L1 processing. The deframer only interrupts the TDI from sending FEC blocks, which interrupts the bit deinterleaving. The decoded L1 signaling from the BCH decoder is sent at the maximum speed to the deframer in order to be used quickly by the deframer. But for the decoded data, the BCH smoothes the output in order to help to dejitter buffer. The two kinds of flows (signaling and data) do not have the same constraints. Using separate output memories for the two flows allows smoothing the decoded data for the dejitter buffer, and at the same time, quickly outputting L1 signaling to the deframer without having to wait until the end of PLP data output, which may be being output more slowly, depending on the bit rate.

Figure 10:
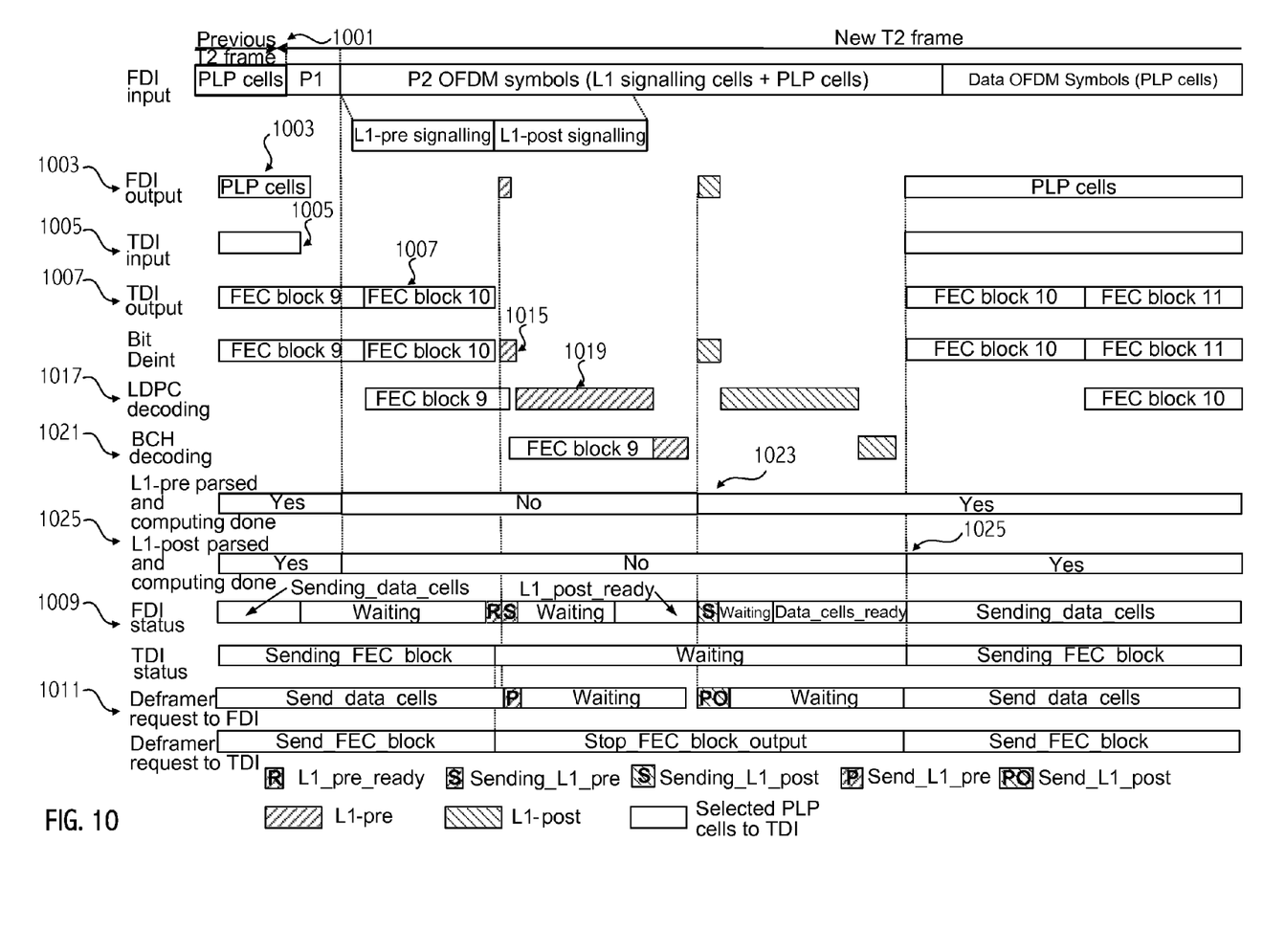
FIG. 10 illustrates L1 and PLP flow management using request/status exchange.

FIG. 10 illustrates another view of the operation of various aspects of the system. Note that the time scale of the different processing slots shown in FIG. 10 are not to scale in order to make certain aspects of the data flow visible. The boundary between the previous T2 frame and the new T2 frame at the FDI input is shown in 1001. The FDI output is shown at 1003. The TDI input is shown at 1005 and the TDI output is shown at 1007. As can be seen in FIG. 10, the TDI is supplying FEC block 10 at the time the FDI is receiving the L1 signaling cells in P2. FDI status output is shown at 1009 and R indicates that L1_pre_ready. The deframer requests to the FDI are shown at 1011 and the request to send L1 is indicated at P, which request results in the FDI status as S (sending L1_pre) and the FDI outputs L1_pre cells. The processing of FEC block 10 (from the previous T2 frame) is interrupted in the bit deinterleaver, in response to the TDI FEC output being interrupted by a deframer request to the TDI. Instead the bit deinterleaver processes L1_pre at 1015. The LDPC decoding is shown at 1017. As can be seen, LDPC decoder completes decoding FEC block 9. At 1019 the LPDC decoder decodes L1_pre. BCH decoding is shown at 1021. The BCH decoder finishes decoding FEC block 9 and then decodes the L1_pre. Once L1_pre is parsed and processing is completed as shown as Yes at 1023, the deframer requests the FDI send L1_post and the FDI sends the L1_post. The bit deinterleaver, the LDPC decoder and the BCH decoder process the L1_post, and after L1 processing is complete (Yes at 1025), the TDI resumes its output (resends FEC block 10) from the previous T2 frame and continues with block 11.

Referring again to FIG. 5, the dejitter buffer 535 receives a jittered packetized stream from the base band framer decoder 531. The stream may transport packets of a single PLP or of two PLPs, where the first PLP is a Data PLP and the second PLP is a Common PLP. When there are a Data and a Common PLP, the 2 PLP streams are received sequentially and must be recombined properly at the end to provide a unique output stream. In an embodiment, the dejitter buffer 535 includes a control portion shown as 535 and a defined memory space 550 for a data PLP and memory space 552 for a Common PLP. Either or both of those memory spaces can be subject to an overflow condition, which would result in loss of data.

In order to reduce possibilities of memory overflows, an embodiment utilizes control signals to temporarily stop the output of upstream memories. In particular, to avoid possible overflows in the dejitter buffer, the dejitter buffer, which includes dejitter circuit 535 and dejitter memory 550 for data PLPs and dejitter memory 552 for common PLPs, provides control signals to the TDI to let the TDI know if it should temporarily stop sending FEC blocks of the Data or the Common PLP. Similarly, the TDI may provide a control signal to the FDI to cause the FDI to temporarily stop sending PLP cells to the TDI. Such an approach of controlling upstream memories helps avoid the need for additional buffering and reduces the potential for overflows. Moreover, by providing separate signals for generation of Data and Common FEC blocks, when one of the control signals is active, requesting that the TDI stop sending FEC blocks for the PLP corresponding to the asserted signal, if the other signal is not asserted, the TDI can still send FEC blocks of the other PLP of the nonasserted signal. That helps avoid TDI overflow since it can still send data and dejitter buffer (DJB) underflow since it still receives data.

Referring to FIG. 5, in an embodiment, the dejitter buffer uses control signals 541 td_stop_plp_data and td_stop_plp_common to temporarily stop the TDI from outputting a corresponding PLP when there is a risk of buffer overflow in the dejitter buffer for the corresponding PLP. By monitoring the filling of each PLP buffer 550 and 552 of the dejitter buffer so that if one of the PLP buffers of the dejitter buffer is almost full, the TDI is temporarily stopped for that PLP. Two separate thresholds (td_stop_thr_data and td_stop_thr_common) may be used for the Data buffer and the Common buffer, respectively. If the number of buffer entries is above the threshold, the corresponding td_stop signal is asserted to stop output from the TDI. When the buffer empties sufficiently and crosses below the threshold (or a second threshold for each buffer to provide hysteresis) the control signals to stop the TDI are deasserted. The threshold, which may be programmable, may be computed to stop the TDI as little as possible and for as short a duration as possible.

In an embodiment, if there are two PLPs (Data and Common) and only one of the two PLPs is requested to be stopped by the dejitter buffer (due to risk of dejitter buffer overflow) by asserting the appropriate one of td_stop_plp_data or td_stop_plp_common, the TDI stops the appropriate PLP, but automatically switches to processing the other PLP and outputs FEC blocks for the other PLP. That mechanism still allows emptying the TDI, which reduces the likelihood of TDI overflow and dejitter buffer underflow.

In an embodiment, to avoid overflow in the time cell deinterleaver and to take advantage of FDI memory, a similar mechanism may be implemented using a control signal fd_stop 543. That signal allows the TDI to request the FDI to temporarily stop its output in order to avoid overflow in the time cell deinterleaver. By monitoring the difference between Write and Read addresses of the TDI, the FDI may be temporarily stopped if this difference is below a threshold, and is allowed to provide cells when the difference is above the threshold (or another threshold to provide hysteresis). The threshold may be programmable and may be computed so that the FDI is stopped as little as possible for as short a duration as possible.

The two signals to stop the TDI or FDI (td_stop_plp_data/td_stop_plp_common or fd_stop) can be used to avoid dejitter buffer and TDI memory overflow resulting from the dejitter buffer stopping TDI output. For example, if the dejitter buffer stops the TDI in response to the dejitter buffer approaching an overflow condition, the TDI may also stop the FDI. If the dejitter buffer detects it is close to a full memory (overflow condition) and requests the TDI to stop sending an FEC block for plp_data or plp_common (if any), the TDI can approach an overflow condition for plp_data and/or plp_common so the TDI requests the FDI stop using fd_stop. Using such mechanisms can help optimize the global usage of memory resources.

Figure 11:
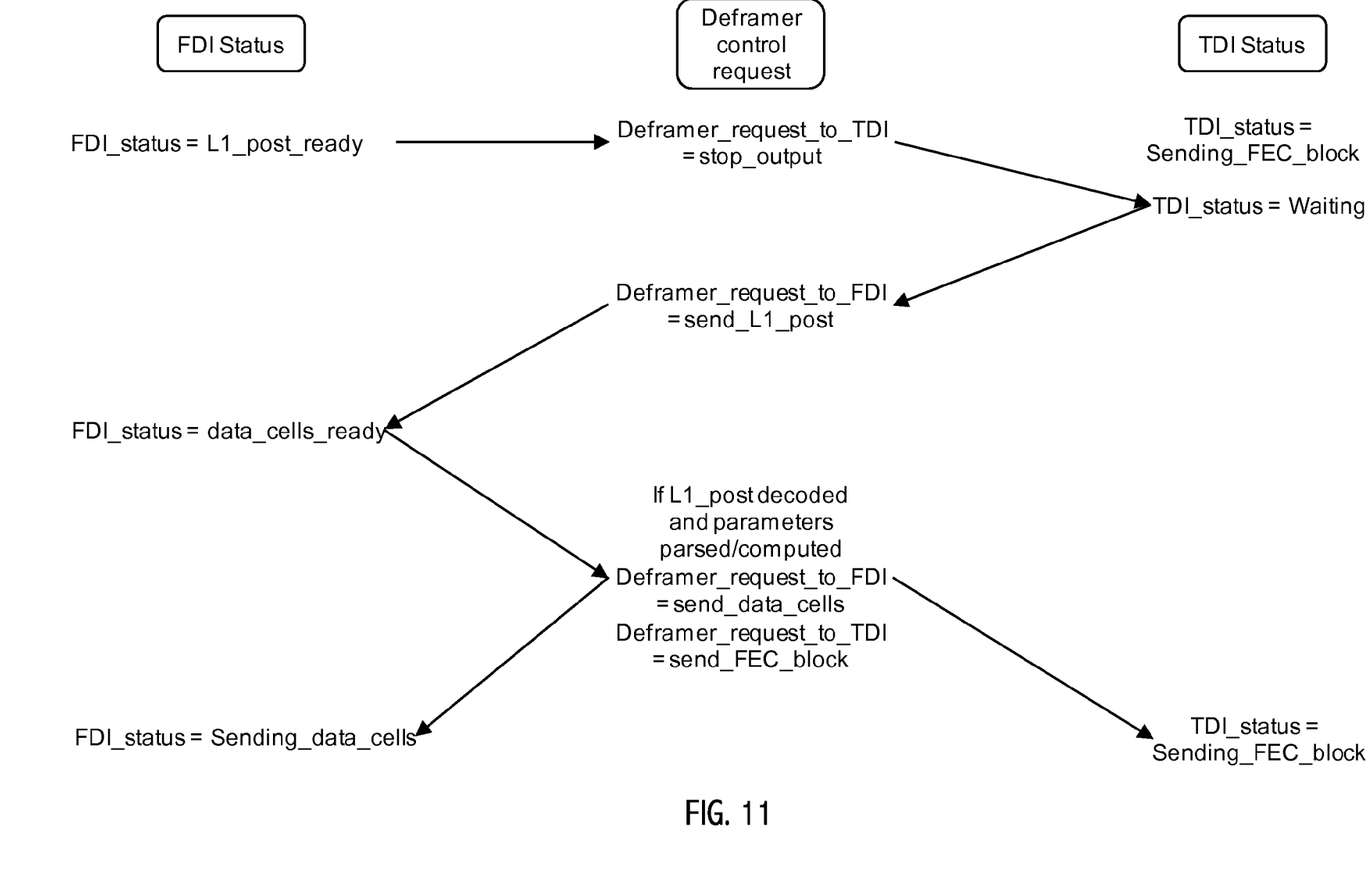
FIG. 11 illustrates data flow control by the deframer for L1-post decoding where L1-pre is fixed and already decoded and parsed.

FIG. 11 illustrates data flow control by the deframer for L1-post decoding where L1-pre is fixed and already decoded and parsed.

The description of the invention set forth herein is illustrative, and is not intended to limit the scope of the invention as set forth in the following claims. For example, various aspects of a receiver have been described to efficiently utilize a single FEC block for L1 and Data and Common PLPs. In addition, approaches to avoid buffer overflow and underflow have been described. In addition, while the examples were described in association with the DVB-T2 standard, the approaches to demodulation described herein may also be applicable to receivers used in other broadcast standards. Note that different embodiments may include aspects of the various embodiments described above in various combinations of features. In addition, other variations and modifications of the embodiments disclosed herein, may be made based on the description set forth herein, without departing from the scope of the invention as set forth in the following claims.

What is claimed is:

1. A receiver comprising:
    a frequency deinterleaver (FDI) coupled to receive data and control information including transmission parameters associated with the data and supply frequency deinterleaved cells corresponding to the data and frequency deinterleaved cells corresponding to the control information;
    a time deinterleaver (TDI) to generate forward error correction (FEC) blocks based on the frequency deinterleaved cells;
    a forward error correction (FEC) circuit coupled to the time deinterleaver to apply forward error correction to the FEC blocks and coupled to the frequency deinterleaver to apply forward error correction to the control information; and
    control logic to control outputs from the frequency deinterleaver and the time deinterleaver to prioritize processing of the control information in the FEC circuit over processing of FEC blocks.

2. The receiver as recited in claim 1 wherein the forward error correction circuit includes a BCH decoder and a low density parity code (LDPC) decoder and wherein processing of the control information is prioritized without interrupting decoding by the LDPC and BCH decoder.

3. The receiver as recited in claim 1 wherein the control logic is associated with a deframer that is coupled to receive frequency deinterleaved data cells and frequency deinterleaved common cells from the frequency deinterleaver and to supply the frequency deinterleaved data and common cells to the time deinterleaver, the common cells and data cells corresponding to common physical layer pipes (PLPs) and data PLPs, respectively.

4. The receiver as recited in claim 1 further comprising a bit deinterleaver and a bit deinterleaver memory, wherein the bit deinterleaver memory is utilized to perform padding insertion and de-puncturing on L1-pre and L1-post signalling.

5. The receiver as recited in claim 1 wherein control logic is configured to stop output of the time deinterleaver in response to an indication of a start of a frame in order to make the forward error correction circuit available for the control information.

6. The receiver as recited in claim 1 wherein control logic is configured to stop output of the time deinterleaver a programmable time period after an indication of a start of a frame in order to make the forward error correction circuit available for the control information.

7. The receiver as recited in claim 1 wherein the control logic is configured to stop the time deinterleaver to allow for processing by the FEC circuit of the control information by allowing the time deinterleaver to finish outputting a current FEC block which is being time deinterleaved by the time deinterleaver.

8. The receiver as recited in claim 1 wherein the control logic is configured to stop the time deinterleaver regardless of whether the time deinterleaver has finished outputting a current FEC block which is being time deinterleaved by the time deinterleaver in order to make the forward error correction circuit available for the control information.

9. The receiver as recited in claim 1 wherein the control logic is configured to stop the time deinterleaver according to a number of cells that have been output by the time deinterleaver of a current FEC block.

10. The receiver as recited in claim 9 wherein if the number of cells is above a threshold number, the TDI is allowed to finish outputting the current FEC block and if it is below the threshold number, the TDI output is stopped.

11. The receiver as recited in claim 1 wherein stopping output of the time deinterleaver before a current FEC block is completely output by the time deinterleaver causes processing of the current FEC block by a bit deinterleaver to be stopped.

12. The apparatus as recited in claim 1 wherein the FEC circuit includes a BCH decoder, the BCH decoder including a first memory associated with decoding control information, and a second memory associated with decoding data.

13. A receiver comprising:
a frequency deinterleaver (FDI);
a time deinterleaver (TDI) coupled to receive data from the FDI and including a time deinterleaver memory;
a forward error correction circuit coupled to the time deinterleaver;
a dejitter buffer coupled to the forward error correction circuit, the dejitter buffer having a first memory portion for a first data type and a second memory portion for a second data type, wherein the dejitter buffer is configured to monitor the first and second memory portions of the dejitter buffer to supply a control signal to stop output of the time deinterleaver if at least one of the memory portions of the dejitter buffer has an amount of data above a threshold.

14. The receiver as recited in claim 13 wherein the dejitter buffer is responsive to which of the first and second memory portions of the dejitter buffer are above the threshold to stop output of a corresponding one of the first and second data types, and when output of a first data type is stopped in the time deinterleaver, the time deinterleaver outputs the second data type.

15. The receiver as recited in claim 13 further comprising:
control logic associated with the time deinterleaver to determine an available storage in the time deinterleaver memory and to supply a control signal to temporarily stop outputting of the data from the frequency deinterleaver if the available storage in the time deinterleaver memory is below a threshold.

16. A method of processing data and control information in received television signals comprising:
receiving an indication of a start of a frame that includes the data and control information;
stopping output from a time deinterleaver (TDI) of forward error correction (FEC) blocks associated with the data in response to the indication in order to make a forward error correction (FEC) circuit available for processing the control information;
sending a request to a frequency deinterleaver to output the control information; and
sending a control signal to the time deinterleaver to resume outputting the data when the control information has been processed by the forward error correction circuit to thereby allow the FEC circuit to process the FEC blocks associated with the data.

17. The method as recited in claim 16 further comprising stopping output of the time deinterleaver a programmable time period after the indication of the start of a frame.

18. The method as recited in claim 16 further comprising stopping the output from the time deinterleaver according to a number of cells that have been output by the time deinterleaver of a current FEC block.

19. The method as recited in claim 16 wherein if the number of cells is above a threshold number, the TDI finishes outputting the current FEC block before stopping and if the number of cells is below the threshold number, the TDI output is stopped before finishing outputting of the FEC block.

20. A method comprising:
receiving data of a first data type and a second data type from a time deinterleaver at a dejitter buffer memory;
monitoring a first portion of the dejitter buffer memory, the first portion for data of the first data type and monitoring a second portion of the dejitter buffer memory, the second portion of the dejitter buffer for data of the second data type;
supplying an asserted first control signal to the time deinterleaver to stop upstream generation of data of the first data type if the first portion of the dejitter buffer memory has an amount of data of the first data type above a first threshold, thereby indicating a potential overflow condition;
stopping upstream generation of data of the first data type in the time deinterleaver responsive to the asserted first control signal;
supplying an asserted second control signal to the time deinterleaver to stop upstream generation of data of the second type if the second portion of the dejitter buffer memory has an amount of data of the second data type that is above a second threshold; and
stopping upstream generation of data of the second data type in the time deinterleaver responsive to the asserted second control signal.

21. The method as recited in claim 20 further comprising generating the first and second data types as respective data forward error correction (FEC) blocks and common FEC blocks, the common and data FEC blocks associated with common physical layer pipes (PLPs) and data PLPs, respectively.

22. The method as recited in claim 21 further comprising continuing generation of a data FEC block when generation of a common FEC block is stopped and continuing generation of a common FEC block when generation of a data FEC block is stopped.

23. The method as recited in claim 21 further comprising determining an output rate of FEC blocks from the time deinterleaver according to a programmable value.

24. The method as recited in claim 23 further comprising determining a forward error correction processing rate according to a second programmable value.

* * * * *